United States Patent

Moon et al.

[11] Patent Number: 5,853,921
[45] Date of Patent: Dec. 29, 1998

[54] METHODS OF FABRICATING PHASE SHIFT MASKS BY CONTROLLING EXPOSURE DOSES

[75] Inventors: Seong-yong Moon, Kyungki-do; In-kyun Shin, Seoul; Ho-young Kang, Kyungki-do, all of Rep. of Korea

[73] Assignee: Samsung Electronics Co., Ltd., Suwon, Rep. of Korea

[21] Appl. No.: 905,792

[22] Filed: Jul. 28, 1997

[30] Foreign Application Priority Data

Sep. 10, 1996 [KR]   Rep. of Korea .................. 96-39148

[51] Int. Cl.⁶ ........................................... G03F 9/00
[52] U.S. Cl. ................................. 430/5; 430/323
[58] Field of Search ................ 430/5, 322, 323, 430/324, 313

[56] References Cited

U.S. PATENT DOCUMENTS 5,695,896  12/1997  Pierrat ........................................ 430/5
5,698,346   1/1996  Sugawara .................................... 430/5

OTHER PUBLICATIONS

Ferguson et al., "Pattern–Dependent Correction of Mask Topography Effects for Alternating Phase–Shifting Masks", SPIE, vol. 2440, 1995, pp. 349–360.

Primary Examiner—S. Rosasco
Attorney, Agent, or Firm—Myers Bigel Sibley & Sajovec

[57] ABSTRACT

A phase shift mask is fabricated by forming a radiation blocking layer on a phase shift mask substrate and forming a photoresist layer on the radiation blocking layer. First portions of the photoresist layer are exposed at a first exposure dose. Second portions of the photoresist layer are exposed at a second exposure dose that is greater than the first exposure dose, such that the second portions of the photoresist layer are wider than the first portions of the photoresist layer. The radiation blocking layer is etched using the photoresist layer as an etch mask, to thereby produce first apertures in the radiation blocking layer beneath the first portions of the photoresist layer and second apertures in the radiation blocking layer which are wider than the first apertures, beneath the second portions of the photoresist layer. The phase shift mask substrate is then etched beneath the second apertures. The first and second exposures are preferably performed by exposing the photoresist layer to electron beams of first and second exposure doses. The first and second portions of the photoresist layer may be overlapping or nonoverlapping. The first and second exposure doses may be multiple exposure doses which cumulatively provide the first and second exposure doses.

20 Claims, 6 Drawing Sheets

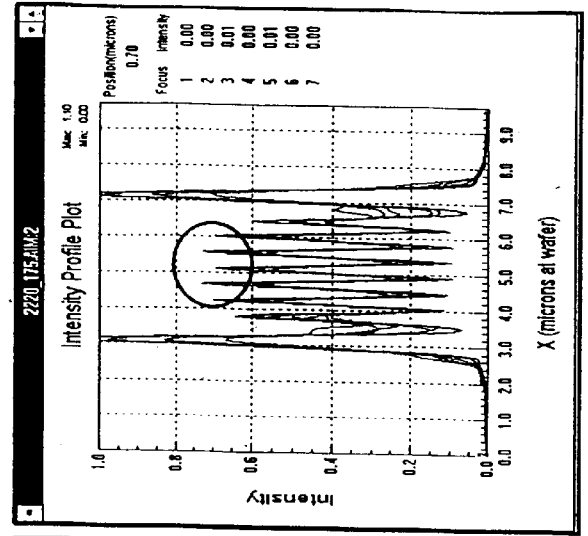
FIG. 13A    14%
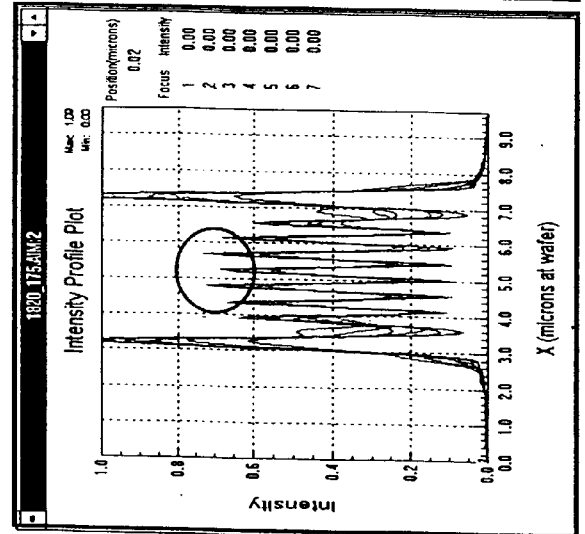
FIG. 13B    18%
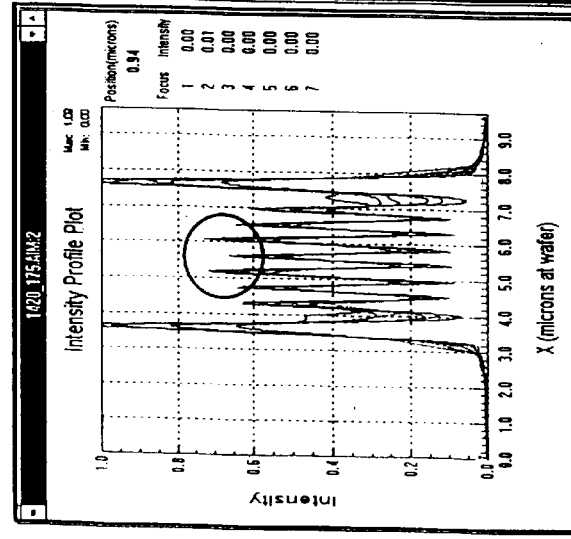
FIG. 13C    22%

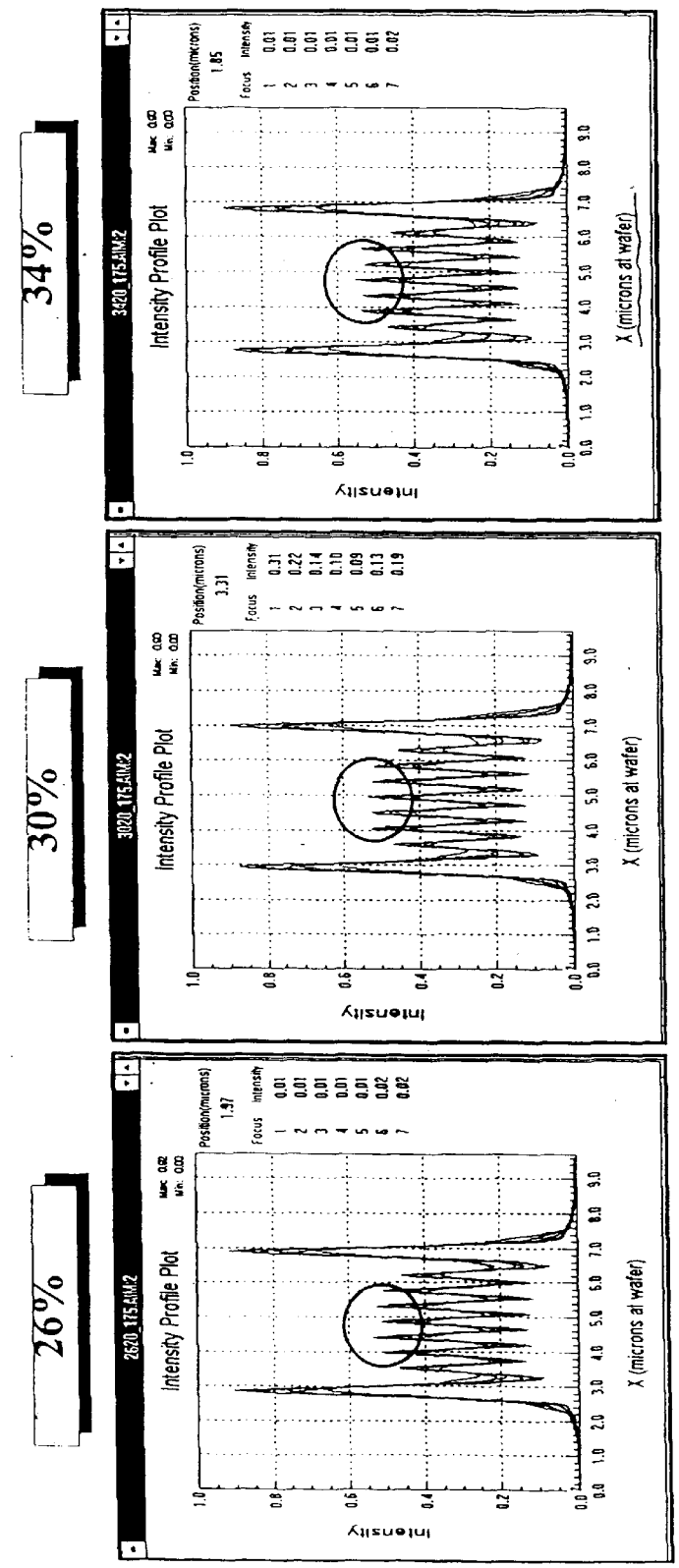
FIG. 13D  26%
FIG. 13E  30%
FIG. 13F  34%

5,853,921

METHODS OF FABRICATING PHASE SHIFT MASKS BY CONTROLLING EXPOSURE DOSES

FIELD OF THE INVENTION

This invention relates to integrated circuit fabrication, and more particularly to methods of fabricating phase shift masks for integrated circuit fabrication.

BACKGROUND OF THE INVENTION

As integration densities of integrated circuit devices continue to increase, it may become increasingly difficult to fabricate fine line widths using conventional photomasks. Photomasks are conventionally used to expose photoresists according to a predetermined pattern. The photoresist is used to pattern an underlying layer such as an integrated circuit substrate, or a conductive or insulating layer. Conventional photomasks may be limited in defining fine line widths for highly integrated devices. Accordingly, phase shift masks are being used as an alternative for increasing integration density.

In contrast with a conventional transparent photomask, the phase shift mask operates on the principle that radiation such as light having different phase can interfere. For example, if radiation such as light from a light source passes through adjacent slits, the light emerging from the slits has different phases that can mutually interfere. When the value of the phase difference satisfies a predetermined criteria, mutual destructive interference can occur between the radiation. A photomask using this interference principle is generally referred to as a "phase shift mask".

Phase shift masks can therefore offer increased resolution and improved depth of focus compared to conventional photomasks. Thus, very fine patterns can be formed compared to conventional photomasks. Phase shift masks are especially useful in forming repeated line-space patterns where phase shifts of 180° between adjacent apertures can produce cancellation of light.

One type of phase shift mask currently being used is referred to as a "Levenson" mask. The Levenson phase shift mask is described in a publication entitled *"Optical/Laser Microlithography VIII"*, SPIE Proceedings, Volume 2440, Feb. 22–24, 1995, pp. 34–36, and U.S. Pat. No. 5,358,829, issued Oct. 25, 1994 to Garafalo et al., entitled *"Phase-Shifting Lithographic Masks With Improved Resolution"*, the disclosures of which are hereby incorporated herein by reference. There are two general fabrication methods for Levenson phase shift masks. The first involves etching of a substrate and the second forms a phase shifting layer on a substrate.

In the first method, a phase shift mask substrate such as a quartz substrate is etched in a predetermined pattern. Thus, phase differences are generated based on the principle that incident radiation which passes through the etched and unetched portions of the phase shift mask substrate will have different path lengths and therefore will have different phases. Accordingly, when the phase difference between radiation transmitted through an etched portion of a phase shift mask substrate and radiation transmitted through an unetched portion is 180°, mutual interference can be created.

FIG. 1 is a cross-sectional view illustrating a conventional Levenson phase shift mask which is fabricated by substrate etching. As shown in FIG. 1, a patterned light-blocking layer 120, such as a patterned chrome (Cr) layer is formed on a phase shift mask substrate such as a quartz substrate 110 using conventional photolithographic techniques. A photoresist film is then formed and patterned, to thereby expose predetermined ones of the radiation transmitting areas on substrate 110. A trench area A is then formed in the exposed areas, for example by dry etching the substrate 110 using the photoresist pattern as an etch mask. The photoresist pattern is then removed to complete the Levenson phase shift mask.

Accordingly, as shown in FIG. 1, trench A acts as a phase shifter, so that the phase difference between the radiation transmitted through the trench area A and the radiation transmitted through the area B is 180°.

It is known, however, that the topography of the etched mask structure can create performance aberrations in the phase shift mask. In particular, FIG. 2 graphically illustrates an aerial image of the intensity of light transmitted through a phase shift mask of FIG. 1. In FIG. 2, the width of the lines and spaces are 0.2 $\mu$m, respectively. Exposure conditions include a numerical aperture of 0.5 and a coherence of 0.3. As shown in FIG. 2, an intensity difference $\Delta I$ may occur between the intensity of light transmitted through the phase shifter and the intensity of light transmitted through an adjacent light transmitting area. This can cause light interference on the sidewall of the trench area. Thus, the critical dimension of the phase shifter can decrease, thereby changing the critical line width difference $\Delta CD$ between the phase shifter and the non-phase shifter areas of the mask.

The above-described performance aberrations are described in publication entitled *"Pattern-Dependent Correction of Mask Topography Effects for Alternating Phase-Shifting Masks"* by Ferguson et al., SPIE, Vol. 2440, February 1995, pp.349–360. In the aforementioned Ferguson et al. publication, two techniques for reducing the aberrations are also described. In the first technique, etch back processes are used to recess the edges of the etched quartz opening beneath the chrome to reduce sidewall scattering. In a second approach, the 180° trenches are increased in size to compensate for the transmission loss due to edge scattering. Thus, equal size line-space gratings are no longer used. Rather, biasing is used to increase the size of the 180° trenches relative to the 0° openings in the chrome layer. See FIG. 14 of Ferguson et al., in which the etched opening is biased to compensate for edge scattering.

Unfortunately, as noted at Page 353 of Ferguson et al.: "The implementation of a biasing approach such as this puts stringent requirements on the address size of the mask writing tool." Accordingly, there continues to be a need for phase shift masks which allow unequal sized openings in the radiation blocking layer without placing stringent requirements on the address size of the mask writing tool.

SUMMARY OF THE INVENTION

It is therefore an object of the present invention to provide improved methods of fabricating phase shift masks.

It is another object of the present invention to provide methods of fabricating phase shift masks which include unequal size apertures in a radiation blocking layer.

It is still another object of the present invention to provide improved methods of fabricating phase shift masks including unequal size apertures which do not place undue requirements on the address size of the mask writing tool.

These and other objects are provided, according to the present invention, by using two different exposure doses to pattern to the photoresist which is used to pattern the radiation blocking layer of a phase shift mask. The differing exposure doses can create wide and narrow patterns in the photoresist without placing stringent requirements on the address size of the mask writing tool. High performance phase shift masks may thereby be fabricated.

In particular, according to the present invention, phase shift masks are fabricated by forming a radiation blocking layer on a phase shift mask substrate and forming a photoresist layer on the radiation blocking layer. First portions of the photoresist layer are exposed at a first exposure dose. Second portions of the photoresist layer are exposed at a second exposure dose that is greater than the first exposure dose, such that the second portions of the photoresist layer are wider than the first portions of the photoresist layer. Stated differently, since the second exposure dose is greater than the first exposure dose, the second exposure areas retain electron beam energy over a wider area than the first exposure areas. It will be understood that the first exposure dose, the second exposure dose or both, may be a cumulative exposure dose which results from multiple exposures.

The radiation blocking layer is then etched using the photoresist layer as an etch mask, to thereby produce the first apertures in the radiation blocking layer beneath the first portions of the photoresist layer and second apertures in the radiation blocking layer which are wider than the first apertures, beneath the second portions of the photoresist layer. The phase shift mask substrate is then etched beneath the second apertures.

It will be understood that the photoresist is preferably developed after it is exposed and prior to it being etched. Moreover, the second portions of the photoresist layer may be exposed prior to exposing the first portions of the photoresist layer. Alternatively, the first and second portions may be at least partially exposed simultaneously.

In a preferred embodiment of the present invention, the photoresist layer is an electron beam-sensitive photoresist layer. Thus, first portions of the photoresist layer are exposed using an electron beam of a first exposure dose. Second portions of the photoresist layer are exposed using an electron beam of a second exposure dose that is greater than the first exposure dose, such that the second portions of the photoresist layer are wider than the first portions of the photoresist layer.

Also preferably, the phase shift mask substrate is etched beneath the second apertures by masking the first apertures in the radiation blocking layer and then etching the substrate using the radiation blocking layer and the masked first apertures as an etch mask. The masking step is preferably performed by patterning a second photoresist layer on the radiation blocking layer including in the first apertures therein. The second photoresist layer may be a laser photoresist layer.

Two embodiments of phase shift mask fabrication methods according to the invention may be employed. In a first embodiment, the first and second portions of the photoresist layer are nonoverlapping. In a second embodiment, at least some of the second portions overlap the first portions.

In particular, in a first embodiment of the present invention, a radiation blocking layer is formed on a phase shift mask substrate and a first photoresist layer is formed on the radiation blocking layer. First portions of the first photoresist layer are exposed at a first exposure dose and second portions of the photoresist layer are exposed at a second exposure dose that is greater than the first exposure dose. The second portions are nonoverlapping with the first portions. The first photoresist layer is developed. The radiation blocking layer is patterned using the first photoresist layer as an etch mask, to thereby produce first apertures in the radiation blocking layer beneath the first portions of the first photoresist layer and second apertures in the radiation blocking layer beneath the second portions of the first photoresist layer. The first photoresist layer is removed and a second photoresist layer is formed on the radiation blocking layer including in the first and second apertures. The second photoresist layer is patterned to expose the phase shift mask substrate beneath the second apertures. The exposed substrate is then etched beneath the second apertures using the second photoresist as an etch mask.

In this embodiment, the first photoresist preferably is an electron beam photoresist, and the second photoresist is preferably a laser photoresist. Also preferably, the second exposure dose is an electron beam dose of between about 130% and 134% of the first exposure dose.

In a second embodiment according to the invention, a radiation blocking layer is formed on a phase shift mask substrate and a first photoresist layer is formed on the radiation blocking layer. First portions of the first photoresist layer are exposed at a first exposure dose. Second selected ones of the first portions of the first photoresist layer are further exposed at a second exposure dose. The first photoresist layer is developed. The radiation blocking layer is then patterned using the first photoresist layer as an etch mask, to thereby form second apertures in the radiation blocking layer beneath the second selected ones of the first portions of the first photoresist layers and first apertures in the radiation blocking layer beneath the first portions of the first photoresist layer other than the second selected ones. The first photoresist layer is removed, and a second photoresist layer is formed on the radiation blocking layer including in the first and second apertures. The second photoresist layer is patterned to expose the phase shift mask substrate beneath the second apertures. The exposed substrate is then etched beneath the second apertures using the second photoresist as an etch mask.

In the second embodiment, the second exposure dose is preferably between about 30% and 34% of the first exposure dose, so that the second selected ones of the first patterns obtain a cumulative exposure dose of about 130–134% of the first exposure dose. Accordingly, the line widths of the phase shifter can be finely regulated by carefully controlling the dosage of the exposure radiation. Thus, critical line width differences of radiation transmitted through a phase shift mask can be reduced or minimized.

BRIEF DESCRIPTION OF THE DRAWINGS

FIGS. 13A–13F are graphs illustrating aerial images of radiation transmitted through a phase shift mask fabricated according to the second embodiment of the present invention.

DETAILED DESCRIPTION OF PREFERRED EMBODIMENTS

Figure 1:
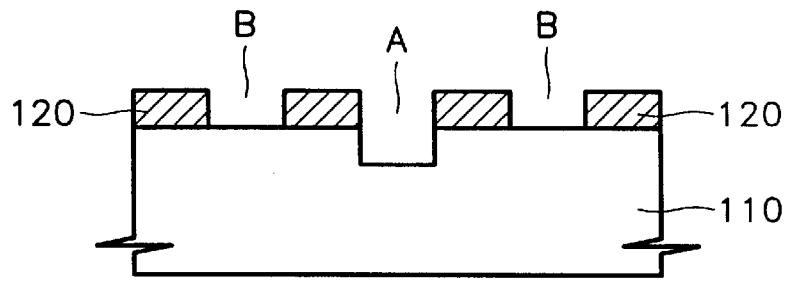
FIG. 1 is a cross-sectional view illustrating a conventional Levenson phase shift mask fabricated by a substrate etching method.
Figure 2:
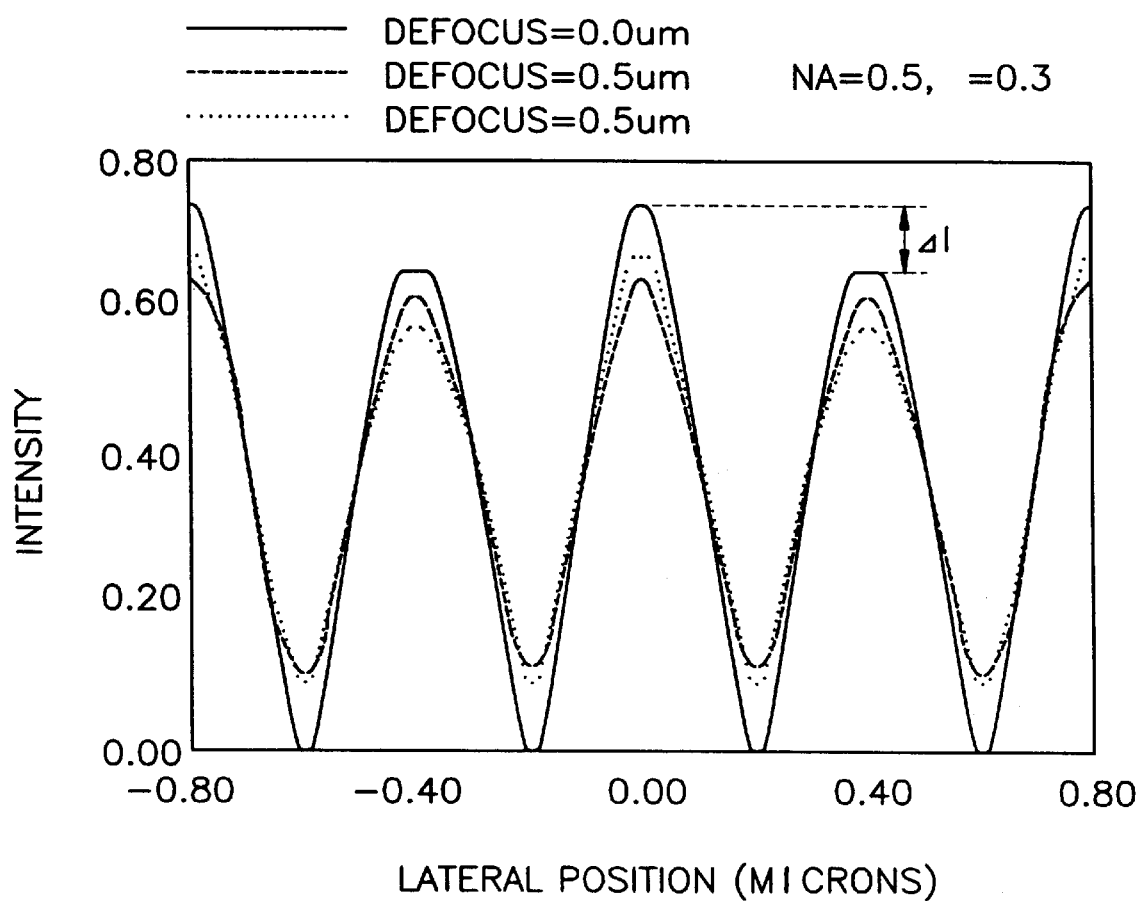
FIG. 2 is a graph which illustrates an aerial image of intensities of radiation transmitted through the conventional phase shift mask shown in FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

FIGS. 3–9 are cross-sectional views illustrating steps of methods for fabricating phase shift masks according to a first embodiment of the present invention.

Figure 3:
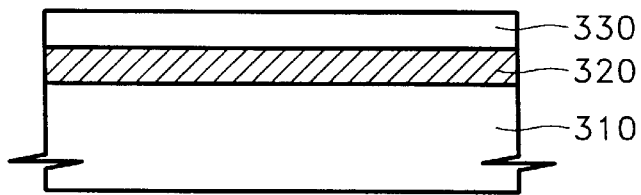
FIGS. 3–9 are cross-sectional views illustrating steps of methods of fabricating phase shift masks according to a first preferred embodiment of the present invention.

Referring to FIG. 3, a radiation (e.g. light) blocking layer 320 is formed on a phase shift mask substrate 310, for example, quartz, to a predetermined thickness by depositing chrome, chrome oxide, or MoSi. Sputter deposition or plasma deposition may be used to deposit the radiation blocking layer 320. Then, a first photoresist layer 330 is formed on the radiation blocking layer 320 by spin coating an electron beam resist to a predetermined thickness.

Figure 4:
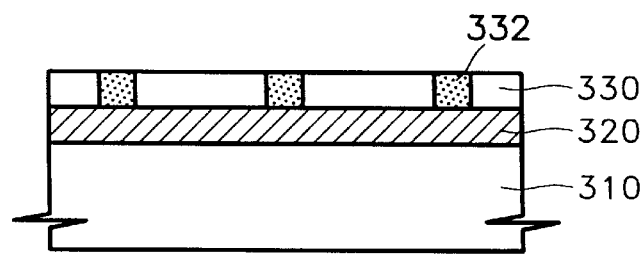

Referring to FIG. 4, first exposure areas 332 are formed by exposing first portions of the first photoresist film 330 to electron beams at a first exposure dose. The first exposure areas 332 define non-shifter areas of the phase shift mask.

Figure 5:
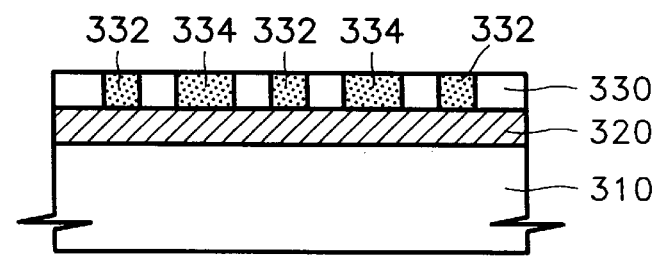

Referring to FIG. 5, second exposure areas 334 are formed by exposing second portions of the first photoresist film between (i.e. nonoverlapping with) first exposure areas 332 to electron beams at a second exposure dose greater than the first exposure dose. The second exposure areas 334 define phase shifter areas of the phase shift mask.

The second exposure dose can be adjusted according to a preferred range of CD of the phase shifter areas, and is preferably adjusted to about 130–134% of the first exposure dose when the width of lines and spaces are 0.2 μm. Since the second exposure dose is greater than the first exposure dose, the second exposure areas 334 retain electron beam energy over a wider area than the first exposure areas 332.

Figure 6:
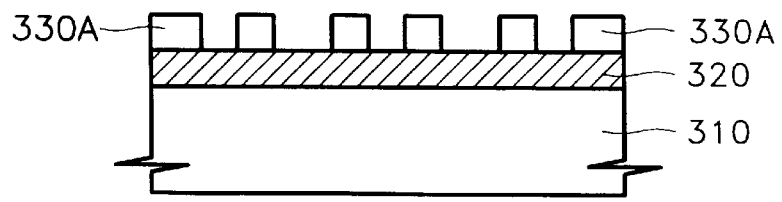

Referring to FIG. 6, the first and second exposure areas 332 and 334 are removed by developing the photoresist having the first and second exposures 332 and 334 with a predetermined development solution. Thus, first photoresist layer pattern 330A is formed to expose the underlying radiation blocking layer 320.

Figure 7:
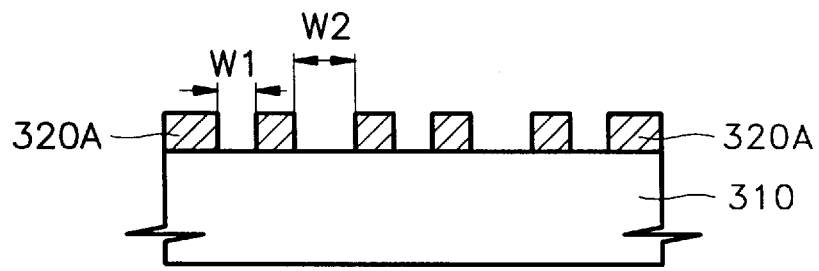

Referring to FIG. 7, the exposed radiation blocking layer 320 is subjected to dry etching, having good anisotropic etching characteristics, such as reactive ion etching (RIE), using the first photoresist pattern 330A as an etch mask. As a result, first and second apertures are formed in the radiation blocking layer, with the width W1 of the first apertures in a non-shifter area being narrower than the width W2 of the second apertures in a phase shifter area. Then, the first photoresist layer pattern 330A is removed.

Figure 8:
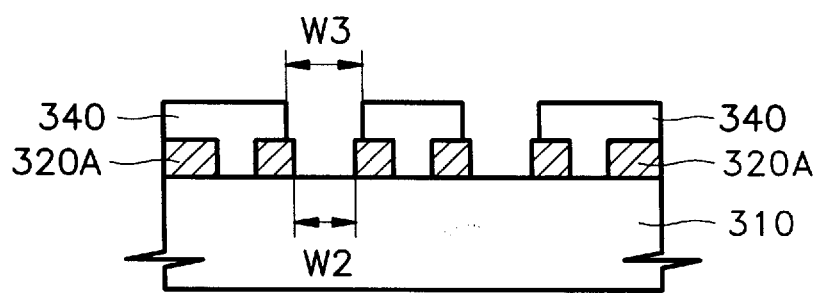

Referring to FIG. 8, a second photoresist layer is formed by depositing a laser resist on the radiation blocking layer including in the first and second apertures. Then, second photoresist film patterns 340 are formed to expose the substrate 310 beneath the second apertures (i.e. the phase shifter area) by selectively exposing the second photoresist film using exposure equipment with a laser as a light source, and developing the exposed second photoresist film. Although the distance W3 between the second photoresist film patterns 340 need only be as large as the width W2 of the phase shifter area, it is preferable that the distance W3 between the second photoresist film patterns 340 be greater than the width W2 of the phase shifter area in order to provide an alignment margin for subsequent etching of the substrate 310.

Figure 9:
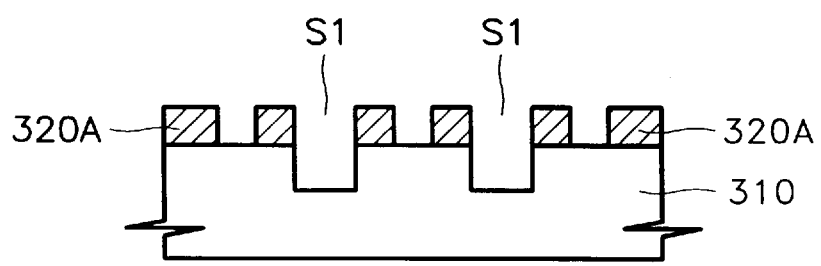

Referring to FIG. 9, trenches S1 are formed in the substrate 310 by dry-etching the exposed portion of the substrate 310, for example, by RIE, using the second photoresist film patterns 340 and the radiation blocking layer 320A as an etch mask. Trenches S1 form the phase shifter of the phase shift mask. Here, the depth of the trench S1 is selected to produce a 180° phase difference between the phase of radiation transmitted through the trench S1 and that of radiation transmitted through the non-shifter areas. Then, the phase shift mask is completed by removing the second photoresist 340.

In the first embodiment, the CD of the phase shifter areas can be adjusted by controlling the exposure dose during the exposure which forms the phase shifter areas of the phase shift mask. Thus, ΔCD can be reduced and preferably minimized in the phase shift mask.

Figure 10:
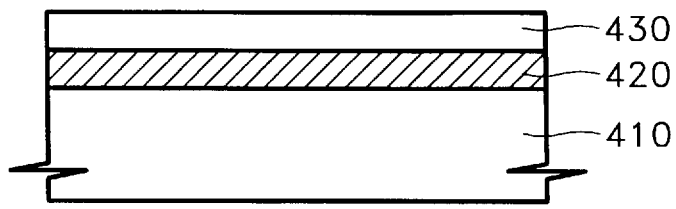
FIGS. 10–12 are cross-sectional views illustrating steps of methods for fabricating phase shift masks according to a second preferred embodiment of the present invention.
Figure 11:
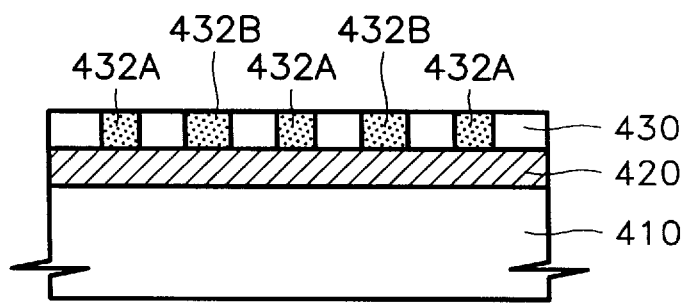
Figure 12:
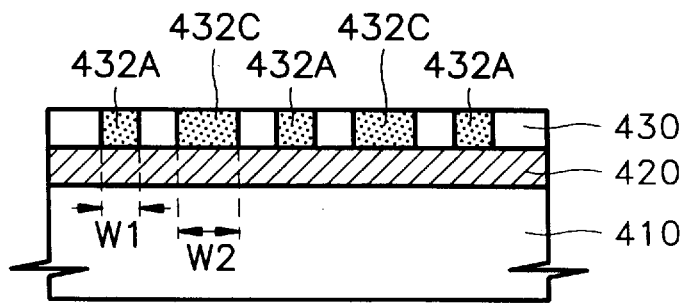

FIGS. 10–12 are cross-sectional views sequentially illustrating phase shift mask fabricating methods according to a second preferred embodiment of the present invention.

Referring to FIG. 10, after a radiation blocking layer 420 is formed on a transparent substrate 410 in the same manner as described in FIG. 3, a first photoresist layer 430 is formed on the radiation blocking layer 420 by spin-coating an electron beam resist.

Referring to FIG. 1, first portions of the first photoresist layer, corresponding to first and second exposure areas 432A and 432B, are simultaneously formed by exposing first portions of the first photoresist film 430 corresponding to non-shifter areas and phase shifter areas of a phase shift mask to electron beams at a first predetermined exposure dose. The first and second exposure areas 432A and 432B retain electron beam energy over areas of the same width.

Referring to FIG. 12, modified second exposure areas 432C are formed by further exposing selected ones of the first exposure areas, corresponding to the second exposure areas 432B, to electron beams at a second exposure dose so that the width of the modified second exposure areas 432C is greater than the width of the first exposure areas 432A.

The second exposure dose can be adjusted according to a preferred range of CD of a phase shifter area, and is preferably between about 30–34% of the first exposure dose when the width of lines and spaces is 0.2 μm. As a result, the width W2 of the modified second exposure areas 432C is greater than the width W1 of the first exposure areas 432A. Then, the phase shift mask is completed in the same manner as was described referring to FIGS. 6–9 of the first embodiment.

It will be understood that although the first and additional second exposure processes are performed with electron beams to form a phase shifter area, the present invention is not limited to using electron beams. Also, doses may be obtained by multiple exposures to provide cumulative exposure doses.

FIGS. 13A–13F graphically illustrate aerial images of phase shift masks fabricated according to the second embodiment of the present invention. In detail, FIGS. 13A–13F represent graphs of intensities of light incident on the surface of wafers when 248 nm-light is projected on each phase shift mask. Each phase shift mask used in FIGS. 13A–13F is fabricated at the second exposure dose set to 14, 18, 22, 26, 30, and 34% of the first exposure dose. The exposure conditions for projecting light on each phase shift mask, such as a NA and coherence σ, are 0.5 and 0.375, respectively.

As shown in FIG. 13, when the additional second exposure dose is controlled to 14–26%, adjacent peaks are unevenly distributed in light intensity profiles based on position of wafers. See the peaks inside the circles. Consequently, when additional exposure is performed at the second exposure doses in FIGS. 13A–13D, ΔCD is not sufficiently decreased. On the other hand, when the second additional exposure dose is set to 30 and 34% of the first exposure dose (FIGS. 13E and 13F), adjacent peaks are evenly distributed in light intensity profiles based on the position of wafers. Therefore ΔCD is reduced and preferably minimized.

From the above results, it can be seen that when the width of lines and spaces is 0.2 μm, preferred results are obtained by setting the second additional exposure dose to about 30–34% of the first exposure dose, in the methods of the second embodiments of the present invention.

Similarly, when a phase shift mask is fabricated according to the first embodiment of the present invention, the same effect can be obtained by setting the second exposure dose for forming a phase shifter area to about 130–134% of the first exposure dose for forming a non-phase shifter area.

As described above, according to the present invention, the line width of the phase shifter can be finely controlled by controlling the dose of exposure radiation. Thus, critical line width differences of radiation transmitted through a phase shift mask can be reduced and preferably minimized.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a phase shift mask having wider phase shifting trenches than non-phase shifting openings, comprising the steps of:

forming a radiation-blocking layer on a phase shift mask substrate;

forming a photoresist layer on the radiation-blocking layer;

exposing first portions of the photoresist layer at a first exposure dose, and second portions of the photoresist layer at a second exposure dose that is greater than the first exposure dose such that the second portions of the photoresist layer are wider than the first portions of the photoresist layer;

etching the radiation blocking layer using the photoresist layer as an etch mask, to thereby produce first apertures in the radiation blocking layer beneath the first portions of the photoresist layer and second apertures in the radiation blocking layer which are wider than the first apertures, beneath the second portions of the photoresist layer, the first apertures forming non-phase shifting openings on the phase shift mask substrate; and etching the phase shift mask substrate beneath the second apertures, to thereby produce phase shifting trenches in the phase shift mask substrate that are wider than the non-phase shifting openings in the phase shift mask substrate.

2. A method according to claim 1 wherein the following step is performed after the exposing step and prior to the etching step:

developing the photoresist.

3. A method according to claim 1 wherein the second portions of the photoresist layer are exposed prior to exposing the first portions of the photoresist layer.

4. A method according to claim 1 wherein the photoresist layer is an electron beam photoresist layer, and wherein the exposing step comprise the step of:

exposing first portions of the photoresist layer using an electron beam of a first exposure dose, and second portions of the photoresist layer using an electron beam of a second exposure dose that is greater than the first exposure dose such that the second portions of the photoresist layer are wider than the first portions of the photoresist layer.

5. A method according to claim 1 wherein the first and second portions of the photoresist layer are nonoverlapping.

6. A method according to claim 1 wherein at least some of the first and second portions overlap.

7. A method according to claim 1 wherein the second portions of the photoresist layer comprise selected ones of the first portions of the photoresist layer.

8. A method according to claim 1 wherein the step of etching the phase shift mask substrate beneath the second apertures comprises the steps of:

masking the first apertures in the radiation blocking layer; and etching the substrate using the radiation blocking layer and the masked first apertures as an etch mask, to thereby produce phase shifting trenches in the phase shift mask substrate that are wider than the non-phase shifting openings in the phase shift mask substrate.

9. A method according to claim 1 wherein at least one of the first exposure dose and the second exposure dose are cumulative exposure doses from multiple exposures.

10. A method according to claim 6 wherein the masking step comprises the step of patterning a second photoresist layer on the radiation blocking layer including in the first apertures therein.

11. A method of fabricating a phase shift mask having wider phase shifting trenches than non-phase shifting openings, comprising the steps of:

forming a radiation blocking layer on a phase shift mask substrate;

forming a first photoresist layer on the radiation blocking layer;

exposing first portions of the first photoresist layer at a first exposure dose;

exposing second portions of the first photoresist layer at a second exposure dose that is greater than the first exposure dose wherein the second portions are non-overlapping with the first portions;

developing the first photoresist layer;

patterning the radiation blocking layer using the first photoresist layer as an etch mask to thereby produce first apertures in the radiation blocking layer beneath the first portions of the first photoresist layer and second apertures in the radiation blocking layer beneath the second portions of the first photoresist layer, the first apertures forming non-phase shifting openings on the phase shift mask substrate;

removing the first photoresist layer;

forming a second photoresist layer on the radiation blocking layer including in the first and second apertures;

patterning the second photoresist layer to expose the phase shift mask substrate beneath the second apertures; and etching the exposed phase shift mask substrate beneath the second apertures, using the second photoresist layer as an etch mask, to thereby produce phase shifting trenches in the phase shift mask substrate that are wider than the non-phase shifting openings in the phase shift mask substrate.

12. A method according to claim 11, wherein the first photoresist layer is an electron beam photoresist layer.

13. A method according to claim 12, wherein the exposing steps are carried out using electron beams.

14. A method of claim 11, wherein the second exposure dose is between about 130–134% of the first exposure dose.

15. The method of claim 11, wherein the second photoresist layer is a laser photoresist layer.

16. A method of fabricating a phase shift mask having wider phase shifting trenches than non-phase shifting openings, comprising the steps of:

forming a radiation blocking layer on a phase shift mask substrate;

forming a first photoresist layer on the radiation blocking layer;

exposing first portions of the first photoresist layer at a first exposure dose;

further exposing second selected ones of the first portions of the first photoresist layer at a second exposure dose;

developing the first photoresist layer;

patterning the radiation blocking layer using the first photoresist layer as an etch mask to thereby form second apertures in the radiation blocking layer beneath the second selected ones of the first portions of the first photoresist layer and first apertures in the radiation blocking layer beneath the first portions of the first photoresist layer other than the second selected ones, the first apertures forming non-phase shifting openings on the phase shift mask substrate;

removing the first photoresist layer;

forming a second photoresist layer on the radiation blocking layer including in the first and second apertures;

patterning the second photoresist layer to expose the phase shift mask substrate beneath the second apertures; and etching the exposed phase shift mask substrate beneath the second apertures, using the second photoresist as an etch mask, to thereby produce phase shifting trenches in the phase shift mask substrate that are wider than the non-phase shifting openings in the phase shift mask substrate.

17. A method according to claim 16, wherein the first photoresist layer is an electron beam photoresist layer.

18. A method according to claim 17, wherein the exposing steps are carried out using electron beams.

19. A method according to claim 16, wherein the second exposure dose is between about 30–34% of the first exposure dose.

20. A method according to claim 16, wherein the second photoresist layer is a laser photoresist layer.

* * * * *